(12) United States Patent
Ling et al.

(10) Patent No.: US 6,223,329 B1
(45) Date of Patent: Apr. 24, 2001

(54) HYBRID DESIGN METHOD AND APPARATUS FOR COMPUTER-AIDED CIRCUIT DESIGN

(75) Inventors: Zhang Qiao Ling; Cai Zhen, both of Singapore (SG)

(73) Assignee: Prosper Design Systems Pte. Ltd., Singapore (SG)

( * ) Notice: Subject to any disclaimer, the term of this patent is extended or adjusted under 35 U.S.C. 154(b) by 0 days.

(21) Appl. No.: 09/098,599

(22) Filed: Jun. 17, 1998

(51) Int. Cl.[7] ...................................................... G06F 17/50
(52) U.S. Cl. .................................................. 716/7; 716/12
(58) Field of Search ....... 716/1–21; 395/500.02–500.19

(56) References Cited

U.S. PATENT DOCUMENTS

| | | | | |
|---|---|---|---|---|
| 5,218,551 | * | 6/1993 | Agrawal et al. ........................ | 716/10 |
| 5,526,276 | * | 6/1996 | Cox et al. ............................... | 716/17 |
| 5,583,788 | * | 12/1996 | Kuribayashi ............................ | 716/14 |
| 5,640,327 | * | 6/1997 | Ting ........................................ | 716/7 |
| 5,815,403 | * | 9/1998 | Jones et al. .............................. | 716/9 |
| 5,850,350 | * | 12/1998 | Shibuya et al. .......................... | 716/8 |
| 5,914,887 | * | 6/1999 | Scepanovic et al. .................... | 716/8 |
| 6,038,382 | * | 3/2000 | Kanazawa ................................ | 716/3 |

OTHER PUBLICATIONS

Suaris et al. ("A quadrisection–based combined place and route scheme for standard cells", IEEE Transactions on Computer–Aided Design, vol. 8, No. 3, Mar. 1989, pp. 234–244) Mar. 1989.*
Heerigel ("Global routing driven floorplanning", IEEE, Euro ASIC '90, pp. 214–219, May 29, 1990).*
Brouwer et al. ("PARAGRAPH: a parallel algorithm for simultaneous placemen and routing using hierarchy", Proceedings of 3rd European Conference on Design Automation, 1992, pp. 328–332, Mar. 16, 1992).*
Khanna et al. ("Parallel hierarchical global routing for general cell layout", Proceedings of Fifth Great Lakes Symposium on VLSI, 1995, Mar. 16, 1995, pp. 212–215).*
C. Niessen, "Hierarchical Design Methodologies and Tools for VLSI Chips," IEEE vol. 71, No. 1, Jan. 1983, pp. 66–75.
Jiri Soukup, "Circuit Layout," IEEE, vol. 69, No. 10, Oct. 1981, pp. 1281–1304.
Masahiro Fukui, et al., "A Block Interconnection Algorithm for Hierarchical Layout System," IEEE, vol. CAD–6, No. 3, May 1987, pp. 383–391.

* cited by examiner

*Primary Examiner*—Kevin J. Teska
*Assistant Examiner*—Phallaka Kik
(74) *Attorney, Agent, or Firm*—James D. Ivey

(57) ABSTRACT

A hierarchical circuit design is divided into independent components which can be processed independently of one another to simultaneously achieve the advantages of both hierarchical and flat paradigms. Blocks of the circuit design are flattened sufficiently to place and route global networks through the blocks. The flattened blocks of the circuit design are de-coupled to form independent blocks. In de-coupling the blocks, pins are added at intersections of the global networks with boundaries of the blocks. The global networks are divided into wire fragments between the pins and components of the flattened circuit design in generally the same place previously occupied by the global networks. Wire fragments inside a particular block of the circuit design are added to the block. Wire fragments outside all blocks are fixed as components of the circuit design. The blocks are therefore de-coupled at the pin positions along the block boundaries. As a result, a hierarchical representation of each block of the circuit design can be reconstructed, complete with internal wire fragments of the global networks, independently of all other blocks of the hierarchical circuit design. For example, another block can be left in the flattened state and processed according to a flat paradigm while the former block is reconstructed and processed according to a hierarchical paradigm.

30 Claims, 10 Drawing Sheets

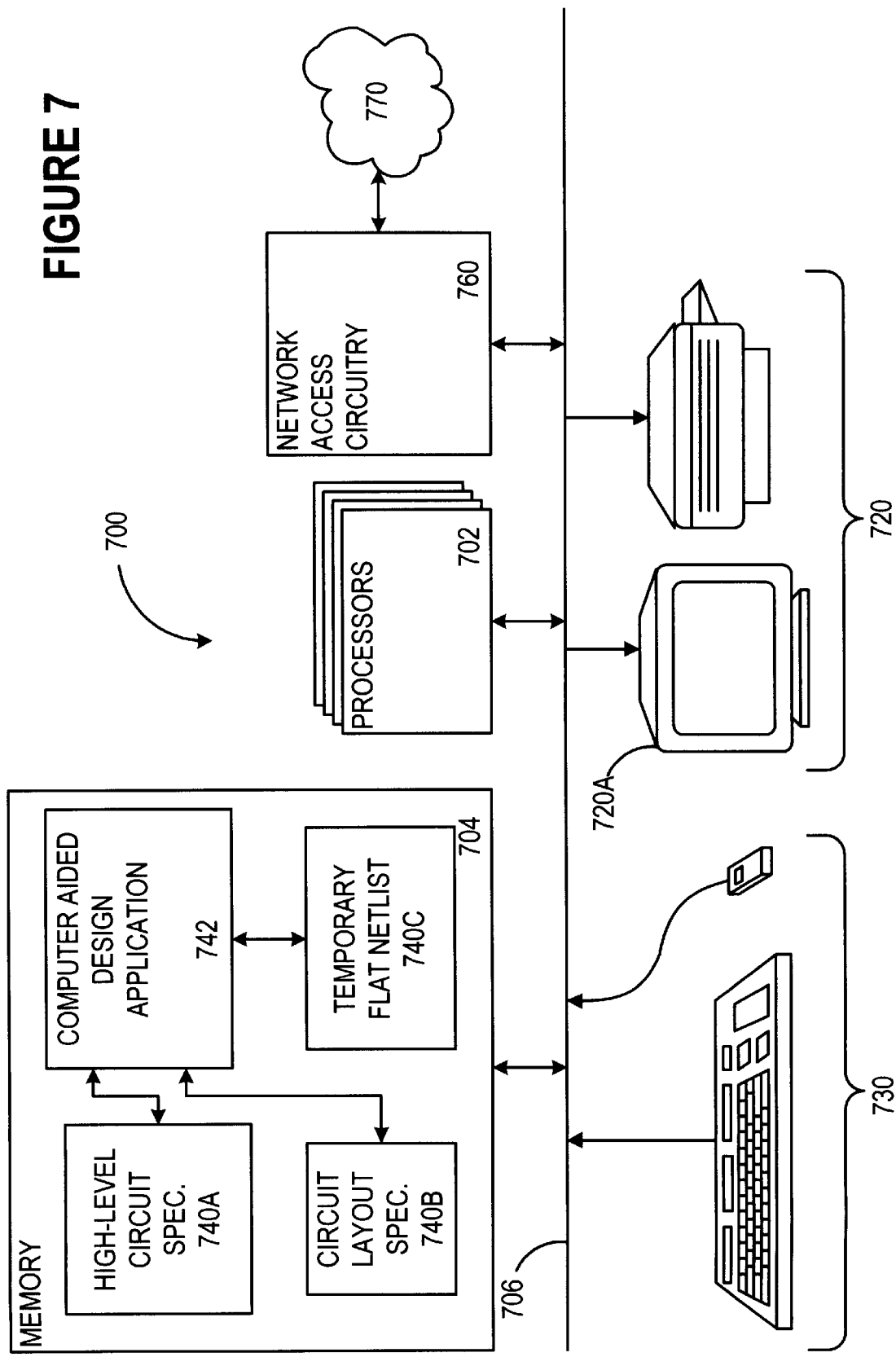

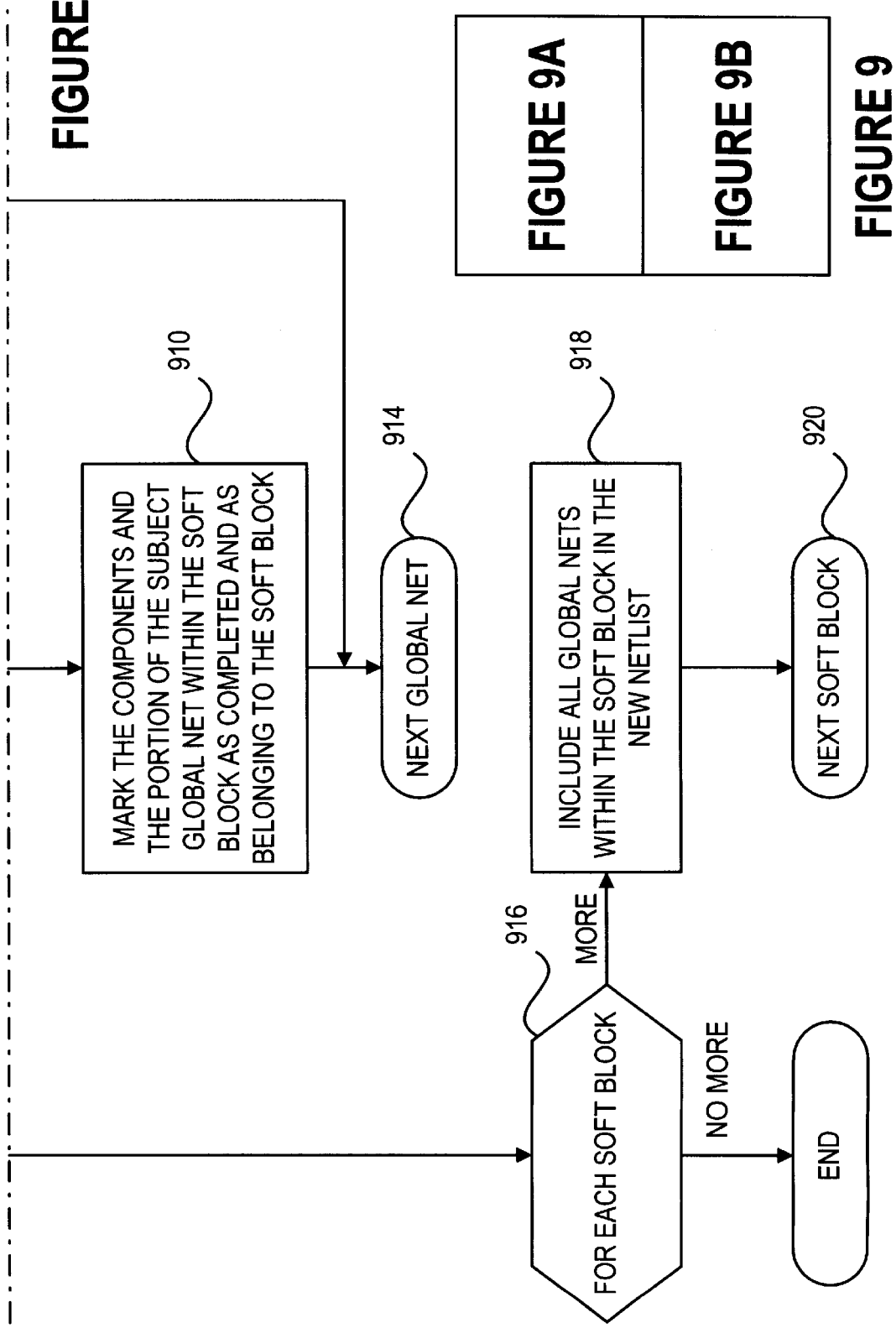

HYBRID DESIGN METHOD AND APPARATUS FOR COMPUTER-AIDED CIRCUIT DESIGN

FIELD OF THE INVENTION

The present invention relates to computer-aided circuit design including automatic placement and routing of integrated circuits and field-programmable gate arrays and, in particular, to a particularly efficient mechanism by which particularly large and complex circuits can be more efficiently designed to a layout level.

BACKGROUND OF THE INVENTION

Many electrical circuits manufactured today are extremely complex and include, for example, many millions transistors and digital logic gates. Circuit complexity has greatly surpassed the capacity of manual design techniques and all but the simplest of modern electrical circuits are designed using computer aided design systems.

Circuit complexity is also challenging the available resources of even the largest, most sophisticated computer-aided automatic layout place and route design systems as well. In general, there are primarily two paradigms by which automatic layout place and route design systems are used by engineers to design electrical circuits layout. The first is called the flat paradigm. In the flat paradigm, the circuit under design is represented entirely at a physical layout abstraction level such that individual standard logic gates and cells are placed directly on a floor map and lines between such standard gates and cells are routed directly within the floor map by automatic layout techniques. The advantage of the flat paradigm is relative ease in optimizing placement of gates and cells and routing of connections between such gates and cells. The disadvantage of the flat paradigm is that the computer resources and computing time required to effect changes in a design increase exponentially with increases of complexity of the circuit under design and can quickly overwhelm the computer capacity and a project design schedule. For example, placing gates and cells of a moderately complex circuit, e.g., having about 200,000 such gates and cells, can take several hours of processing time on relatively high-power workstation computer systems such as the UltraSPARC workstation available from Sun Microsystems, Inc. of Palo Alto, Calif. Routing of lines between such gates and cells of such a circuit can require several days of processing time on the same workstation computer system.

Performing placement and routing according to the second paradigm, i.e., the hierarchical paradigm, requires substantially less computer processing resources than does performing placement and routing according to the flat paradigm. In the hierarchical paradigm, circuit elements which include gates and cells are combined into functional blocks such that the functional blocks serve as abstractions of underlying circuit elements. Such functional blocks can be combined into larger, more abstract, functional blocks of a higher level of a hierarchy. For example, a computer processor can be designed as including a relatively small number of functional blocks including a memory management block, an input/output block, and an arithmetic logic unit. The arithmetic logic unit can be designed to include a relatively small number of functional blocks including a register bank, an integer processing unit, and a floating point processing unit. The integer processing unit can include sub-blocks such as an adder block, a multiplier block, and a shifter block. At the lowest level of the hierarchical design specification, blocks are individual circuit elements such as flip-flops and digital logic gates.

The primary advantage of the hierarchical paradigm is that circuit design engineers can design complex circuits by designing relatively small functional blocks and using such designed blocks to build bigger blocks. In other words, the seemingly insurmountable job of designing a highly complex circuit is divided into small, workable design projects. In addition, functional blocks designed for one circuit can be used as components of a different circuit, thereby reducing redundant effort by the engineers.

In general, fewer computer processing resources are required for placement of circuit elements and routing of connections between the elements according to the hierarchical paradigm rather than according to the flat paradigm. Such is generally true since network routing is typically performed at a particular level of the hierarchy prior to replacing blocks at the level with the component sub-blocks of the blocks. As a result, the networks to be routed at any particular level is typically significantly more simple than networks to be routed in a flat paradigm, i.e., all networks of the circuit.

The primary disadvantage of the hierarchical paradigm is that accuracy and detail in global network routing suffers substantially. For example, routing a network at the highest level is generally based on an approximate placement of elements of blocks of the circuit design since such elements are not actually placed until lower levels of the hierarchy are processed. In some instances, networks are routed only to a block and are not further routed, i.e., to an individual element within the block, until lower levels of the hierarchy are processed. Such makes minimization of signal skew, i.e., different arrival times of a single signal at different gates and/or cells of the circuit, particularly difficult within the hierarchical paradigm. There are several conventional ways to minimize timing delay skews of such global networks, including "Clock-Tree-Synthesis" which requires that the circuit design under development be "flat" to minimize the timing delay skew. In fact, signal skew is generally best minimized according to the flat paradigm in which placement of individual gates and cells can be more directly controlled. Global network routing is particularly difficult in hierarchical circuit designs since, in such hierarchical designs, functional blocks are somewhat abstract and placement of elements within such functional blocks are soft, i.e., are not yet precisely fixed.

What is needed is a system by which a hierarchical design can be more efficiently and accurately rendered to a layout-level circuit specification to thereby provide the advantages of both the flat and hierarchical paradigms.

SUMMARY OF THE INVENTION

In accordance with the present invention, a hierarchical circuit design is divided into independent components which can be processed independently of one another to simultaneously achieve the advantages of both hierarchical and flat paradigms. In particular, blocks of the hierarchical circuit design are flattened sufficiently to place and route global networks through the blocks. The flattened blocks of the hierarchical circuit design are then de-coupled to form independent blocks. In de-coupling the blocks, pins are added at intersections of the global networks with boundaries of the blocks. The global networks are divided into wire fragments between the pins and components of the flattened circuit design in generally the same place previously occupied by the global networks. Accordingly, placement, routing, and network timing of the global networks are accurately represented and preserved by the wire fragments. Wire fragments which are inside a particular block of the circuit design are added to the block. Wire fragments which are outside all blocks are fixed as components of the circuit design. The blocks are therefore de-coupled at the pin positions along the block boundaries.

As a result, each block of the hierarchical circuit design can be reconstructed into a hierarchical representation, complete with newly added wire fragments of the global networks, independently of all other blocks of the hierarchical circuit design. For example, another block can be left in the flattened state and processed according to a flat paradigm while the former block is reconstructed to a hierarchical representation and processed according to a hierarchical paradigm. A circuit design engineer is free to employ whichever paradigm is most suitable to a particular component of the hierarchical circuit design irrespective of which paradigm is most suitable to other components. This flexibility represents a significant improvement in computer aided circuit design.

The global networks are routed and placed using flat paradigm with generally only flattening those components of the circuit design which are needed for such routing and placement. Accordingly, global networks can be routed in relatively high precision and accuracy while much of the substance of the entire circuit under design is represented in a hierarchical form. Accuracy in routing global networks is particularly important when designing a circuit and such affects timing of signal propagation through such a circuit. In addition, since routing is initially limited to global networks, such routing can be accomplished with relatively little computer resources as global networks typically represent a relatively small portion of the circuit under design. Routing of local networks, i.e., networks which exist only within a particular block, is postponed until the block itself is processed independently of other components of the circuit under design.

Enabling independent processing of individual blocks of the circuit design reduces significantly the amount of required computer processing resources. Such is the case since each block of the circuit design is significantly less complex than the entirety of the circuit design, and computer processing resources required for processing a particular circuit is exponentially related to the complexity of the circuit. Accordingly, the sum of required processing resources for processing individual components of the circuit design is significantly less than the required processing resources for processing the circuit design as a whole.

This hybrid paradigm in which both flat and hierarchical paradigms can be used facilitates easy modification of a circuit design. For example, once outside wire fragments are fixed as components of the circuit design, a block of the circuit design can be modified and flattened and can be subsequently modified and flattened without requiring flattening of other blocks of the circuit design. Accordingly, significant processing resources are saved in the multiple iterations of modification and flattening typically required to arrive at a finished design by a circuit design engineer. In a typical circuit design, numerous soft blocks can be processed individually, thereby realizing significant efficiency improvements relative to the simple two soft block example described herein.

Furthermore, each of the blocks of a circuit design can be processed concurrently and can be processed in separate computer systems. Such concurrent processing can significantly reduce the amount of time required to process and finalize the blocks of the circuit design. In addition, the division of circuit design components described above can be used at any level of a hierarchical circuit design.

BRIEF DESCRIPTION OF THE DRAWINGS

FIG. 7 is a block diagram of a computer system within which a computer aided design application in accordance with the present invention executes.

DETAILED DESCRIPTION

Figure 1:
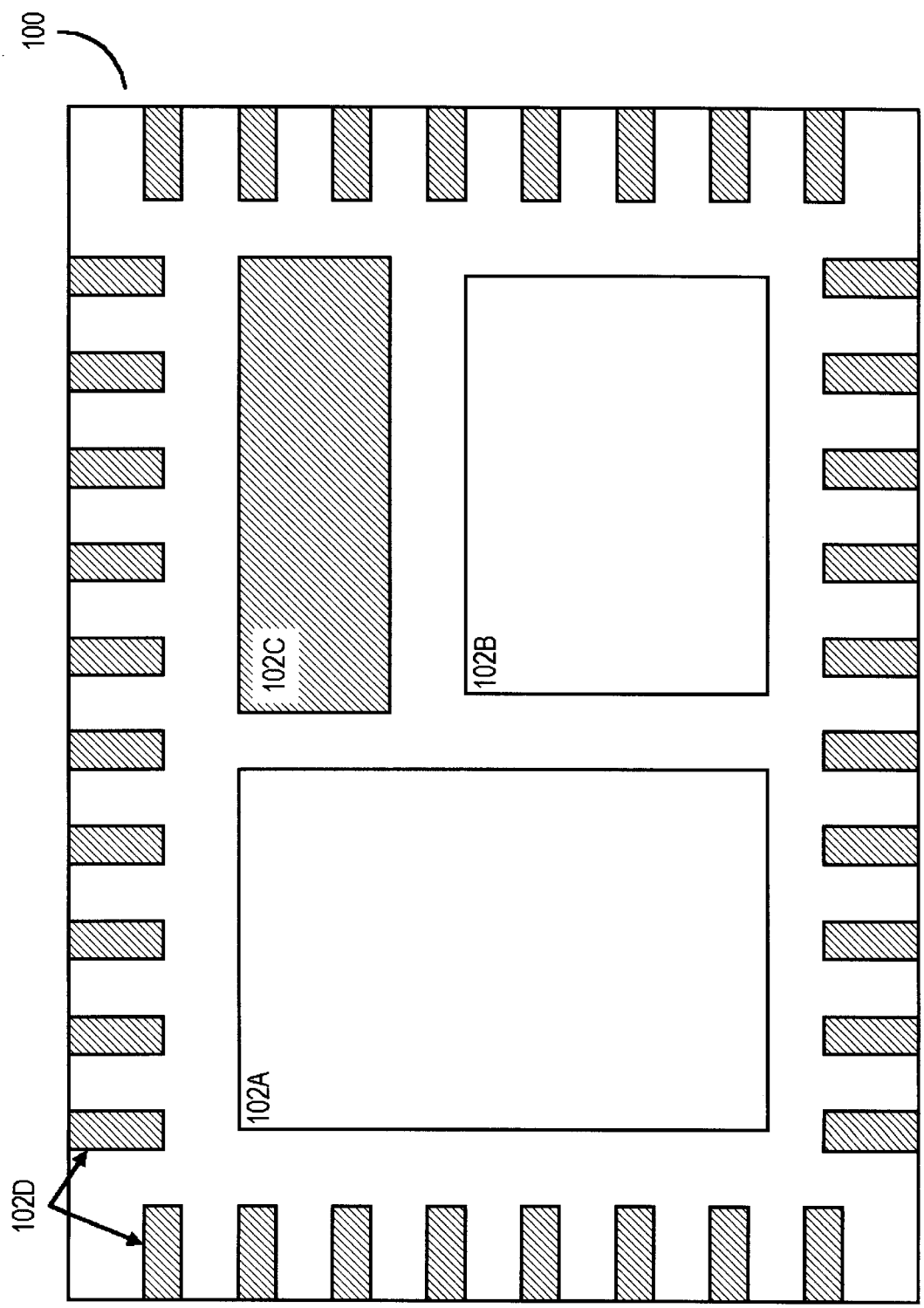
FIG. 1 is a block diagram of a circuit design which include a number of blocks in a hierarchical representation.

In accordance with the present invention, a hierarchical circuit design is divided into sub-circuits which can be processed independently and even concurrently to thereby simplify the processing and computer resources required to realize a circuit layout design from a hierarchical circuit design. A result is preservation of the accuracy of global nets of the flat paradigm to establish an interblock network such that individual blocks can be processed independently of one another. FIG. 1 shows a floor plan of circuit design 100 which is particularly simple to facilitate understanding and appreciation of the present invention. Circuit design 100 includes only two soft blocks 102A–B and one hard block 102C. The surrounding blocks 102D are pads of circuit design 100. A pad is generally a conducting element of a circuit design which are used to connect electrical wires between the circuit and its package frame. As used herein, a soft block is a portion of a circuit design specified only in logical connectivity information such as Design Exchange Format (DEF) netlist without specific details regarding the placement of individual elements and routing of lines, and a hard block is a portion of a circuit design in which the physical layout of individual elements, including such placement and routing, has been completed and fixed. Accordingly, soft blocks 102A–B can be modified relatively easily by human circuit design engineers to effect changes in circuit design 100 while hard block 102C generally can not be modified. Of course, circuit design 100 can include numerous soft blocks and hard blocks. Soft blocks 102A–B and hard block 102C are merely illustrative examples.

Figure 8:
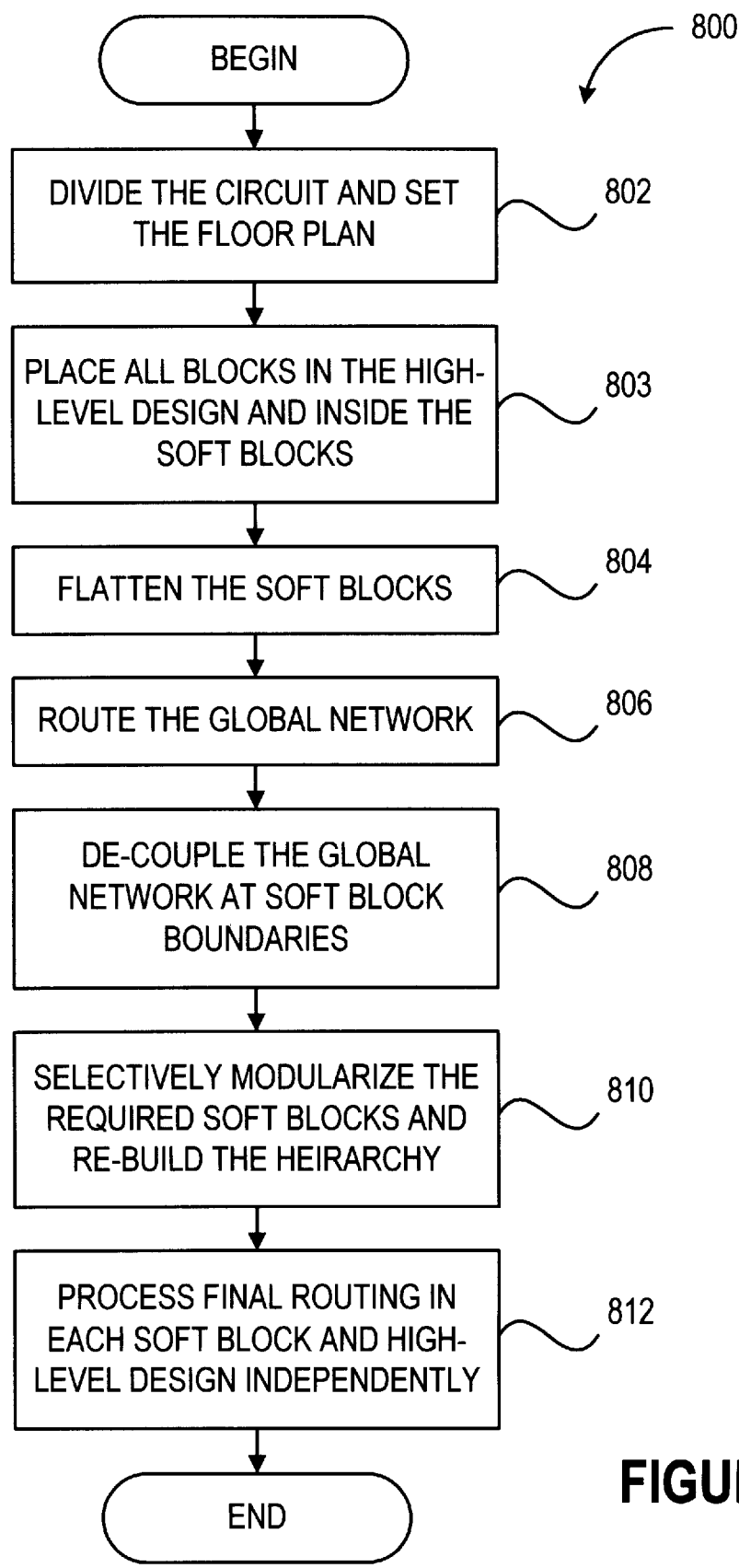
FIG. 8 is a logic flow diagram of the division and independent processing of blocks of a circuit design in accordance with the present invention.

Processing circuit design 100 according to the present invention is illustrated in logic flow diagram 800 (FIG. 8). In step 802 with which logic flow diagram 800 begins, a human circuit design engineer logically divides circuit design 100 (FIG. 1) into various blocks, e.g., soft blocks 102A–B and hard block 102C. The blocks into which circuit design 100 is divided can include hard blocks, soft blocks, and groups of gates. In addition, the blocks have proper timing and other constraints which are met by the human circuit design engineer in forming the blocks of circuit design 100 using conventional techniques and tools. In addition, the human circuit design engineer forms a floor plan for the blocks of circuit design 100 to thereby estimate relative positions of blocks 102A–C. Positions of inter-block connection pins of circuit design 100 are subsequently based upon the placement of blocks 102A–C in step 802 (FIG. 8). Accordingly, accuracy in estimating the area required by respective blocks of circuit design 100 (FIG. 1) and inter-block timing facilitates greater accuracy in predicting the final relative positions of the blocks of circuit design 100 in forming the floor plan. The human circuit design engineer accomplishes the placement of blocks 102A–C using any of a number of conventional and well-known techniques.

Figure 2:
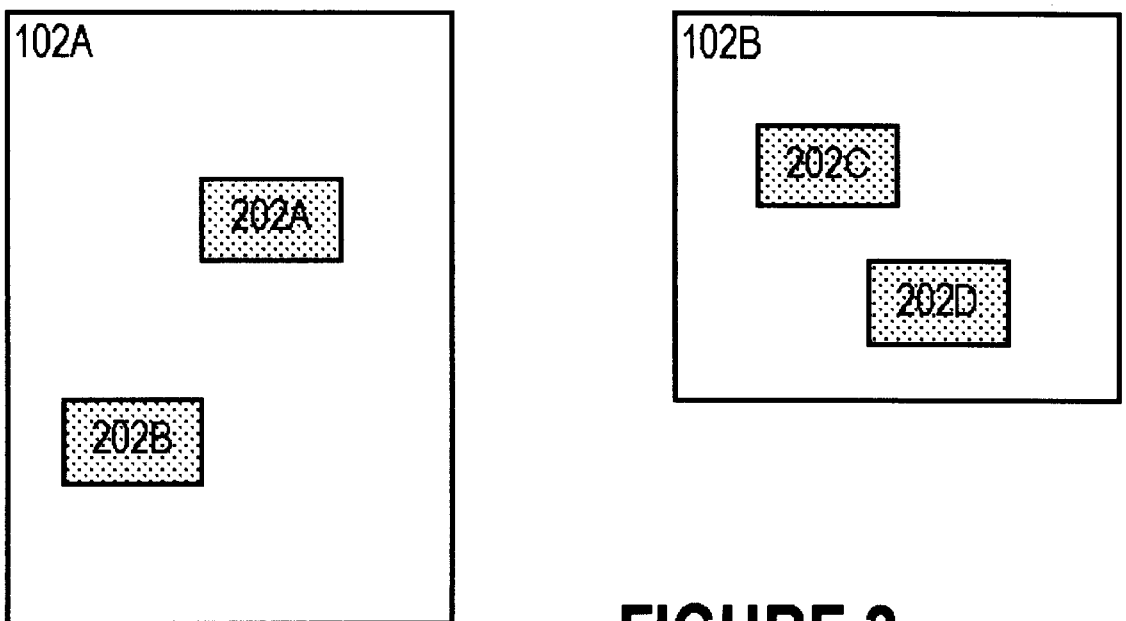
FIG. 2 is a block diagram of two of the blocks of the circuit design of FIG. 1.
Figure 6:
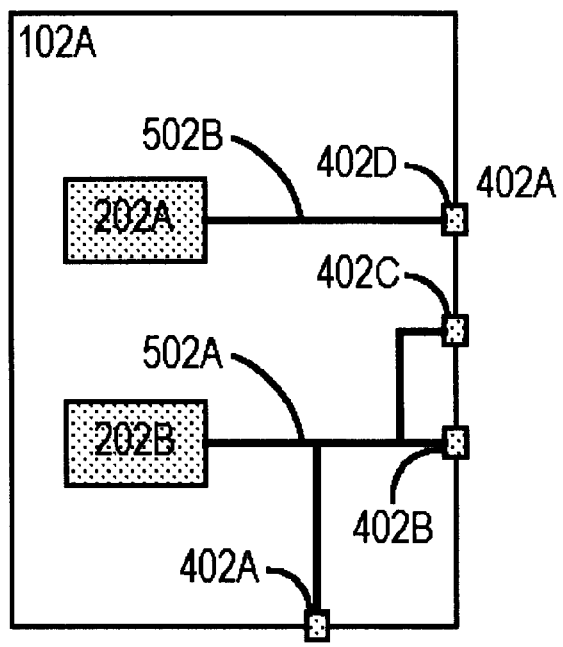
FIG. 6 is a block diagram of one of the soft blocks of FIG. 5 including inside wire fragments in accordance with the present invention.
Figure 3:
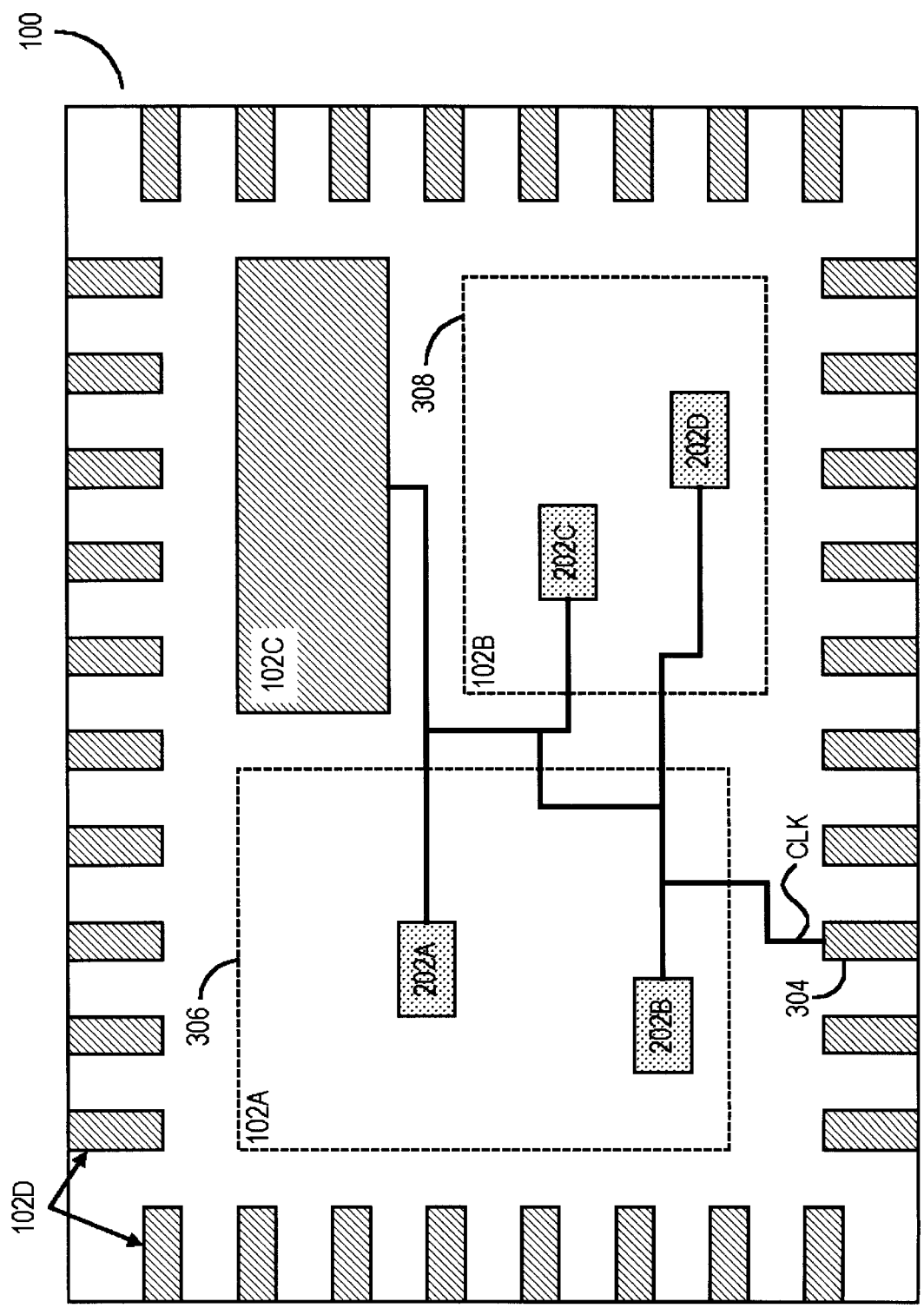
FIG. 3 is a block diagram of the circuit design of FIG. 1 in which soft blocks have been flattened and a global network has been routed in accordance with the present invention.

In step 804 (FIG. 8), the circuit designer places individual electrical components, e.g., standard gates and cells, of each of blocks 102A–C (FIG. 1) into relatively optimal positions within the boundaries of each of blocks 102A–C. Such is accomplished using a conventional automatic placer such as Qplace, which is commercially available from Cadence Design Systems, Inc., USA. In step 804 (FIG. 8), the circuit design engineer places the individual components of all blocks, e.g., blocks 102A–C, both within circuit design 100 and within each respective block. For example, sub-blocks 202A–B (FIG. 2) are placed within soft block 102A and within circuit design 100 (FIG. 3). Similarly, sub-blocks 202C–D (FIG. 2) are placed within soft block 102B and within circuit design 100 (FIG. 3). As used herein, placing an element of a block of elements within a circuit design refers to determining a relative position of the element or block within the circuit design and storing the relative position within a memory of a computer.

The result of step 804 (FIG. 8) is a high-level circuit specification 740A (FIG. 7) which includes data specifying the blocks, sub-blocks, and floor plan formed with relative positions determined in the manner described above. In one embodiment, high-level circuit specification 740A is conventional in form as a layout floor plan with a two-level hierarchy. The top-level floor plan includes blocks 102A–C (FIG. 3), and the block-level includes sub-blocks 202A–D.

In step 806 (FIG. 8), computer aided design (CAD) application 742 (FIG. 7) converts high-level circuit specification 740A from a hierarchical representation to a flat representation in which the abstraction of physical design of individual elements of blocks 202A–D and 102C of circuit design 100 are presented in a single level (FIG. 3). The dashed-line rectangles 306 and 308 show the original soft block boundaries of blocks 102A and 102B, respectively. CAD application 742 (FIG. 7) maintains all the conversion histories of each of blocks 102A–C and their connections in memory 704. CAD application 742 (FIG. 7) stores the flattened circuit design as a temporary flat netlist 740C in memory 704.

At this point, the flattened specification of circuit design 100 (FIG. 1) is preliminary. The circuit design engineer may still evaluate and alter circuit design 100. In conventional hierarchical circuit design, flattening of the circuit design is essentially finalization of the design and further changes to the design are somewhat difficult. In general, the entirety of the circuit design must be flattened once again to see the effect of changes made to the hierarchical design specification. As a result, various empirical trials of various modifications to the circuit design require significant processing by a computer aided design system. However, CAD application 742 (FIG. 7) significantly simplifies such a task in the manner described more completely below.

It should be further noted that in flattening circuit 100 (FIG. 1) in step 806 (FIG. 8), CAD application 742 (FIG. 7) only performs the placement portion, i.e., only places elements of circuit design 100 (FIG. 1) using conventional automatic placement techniques. Routing of lines connecting the placed circuit elements is postponed until later as described below more completely. In performing placement and routing on a circuit design, automatic routing typically requires much more computer processing resources than does automatic placement. Therefore, automatic placement the circuit elements of circuit design 100 to thereby flatten circuit design 100 in step 806 (FIG. 8) requires substantially less computer processing resources than do conventional automatic placement and routing systems.

In step 808 (FIG. 8), CAD application 742 (FIG. 7) employs a conventional automatic router such as Silicon Ensemble from Cadence Design Systems, Inc. to route global networks through the flattened circuit design as specified in temporary flat netlist 740C. Global networks include any lines which carry signals which travel between blocks, e.g., blocks 102A–B (FIG. 1) of circuit design 100. For example, flattening of circuit design 100 results in replacement of blocks 102A–B with sub-blocks 202A–D (FIG. 3) and circuit design 100 specifies a clock signal CLK coupled between elements 202A–D and a pin 304 of circuit design 100. Accordingly, the clock signal CLK travels between blocks 102A–B and the line which carries clock signal CLK is therefore a global network. In step 808 (FIG. 8), CAD application 742 (FIG. 7) routes the clock signal CLK to specify global network CLK (FIG. 3) including the physical placement of global network CLK in the final physical layout design specification of circuit design 100.

It should be appreciated that, while automatic routing of lines of a circuit design requires much more computer processing resources than does automatic placement of circuit elements, global networks typically represent a rather small subset of all lines in a circuit design and require relatively little computer processing resources for automatic routing of such global networks. As used herein, routing of lines in a circuit design refers to determining relative positions within the circuit design through which a line is to be placed within a circuit and storing data in the memory of a computer representing those relative positions as specifying the path of a line through the circuit design.

In step 810 (FIG. 8), CAD application 742 (FIG. 7) de-couples the global networks at soft block boundaries 306–308 (FIG. 3). For example, CAD application 742 (FIG. 7) adds to design specification 100 as represented in temporary flat netlist 740C pins 402A–F (FIG. 4) at boundaries 306–308 of soft blocks 102A–B, respectively. In de-coupling the global networks, CAD application 742 (FIG. 7) determines the relative positions at which a global network intersects a soft block boundary and creates a pin at each such intersection. For example, CAD application 742 (FIG. 7) creates pins 402A–F (FIG. 4) at the intersections of soft block boundaries 306 and 308 with global network CLK. In addition, CAD application 742 (FIG. 7) divides global network CLK at the locations of pins 402A–F (FIG. 4) to form wire fragments 502A–F. In addition, CAD application 742 (FIG. 7) distinguishes between those of wire fragments 502A–F which are inside soft block boundaries 306 and 308 and those of wire fragments 502A–F which are outside any soft block boundaries 306 and 308. CAD application 742 (FIG. 7) adds those of wire fragments 502A–F which are outside soft block boundaries 306 and 308 to the highest level of the hierarchy of circuit design 100 as physical elements, i.e., elements which are fixed in place in the floor plan of circuit design 100. In this illustrative example, such wire fragments include wire fragments 502C and 502F and the portion of global network CLK extending from pin 304 to pin 402A. CAD application 742 (FIG. 7) characterizes wire fragments 502A (FIG. 4) and 502B as components of soft block 102A and characterizes wire fragments 502D and 502E as components of soft block 102B. Step 810 (FIG. 8) is described more completely below in conjunction with FIG. 9.

It should be noted that in routing the global networks in step 808 as described above, all timing and signal skew issues are resolved using conventional techniques. Accordingly, it is preferred that wire fragments 502A–F are routed along precisely the same path along which global network CLK is routed. By positioning pins 402A–F at intersections between soft block boundaries 306 and 308, coincidence of global network CLK and wire fragments 502A–F is essentially assured.

When CAD application 742 (FIG. 7) has de-coupled all global networks of circuit design 100 (FIG. 4) in the manner described above, processing transfers to step 812 (FIG. 8). In step 812, CAD application 742 (FIG. 7) modularizes one or more selected ones of the flattened soft blocks and reconstructs the hierarchy of circuit design 100 from temporary flat netlist 740C (FIG. 7) in accordance with the history maintained as described above. The human circuit design engineer specifies, using conventional user-interface techniques, one or more of the soft blocks of circuit design 100, e.g., soft blocks 102A–B, to thereby select the one or more soft blocks for hierarchical reconstruction. In one embodiment, CAD application 742 (FIG. 7) recognizes a default specification of all such soft blocks if the human circuit design engineer does not specifically choose.

Figure 4:
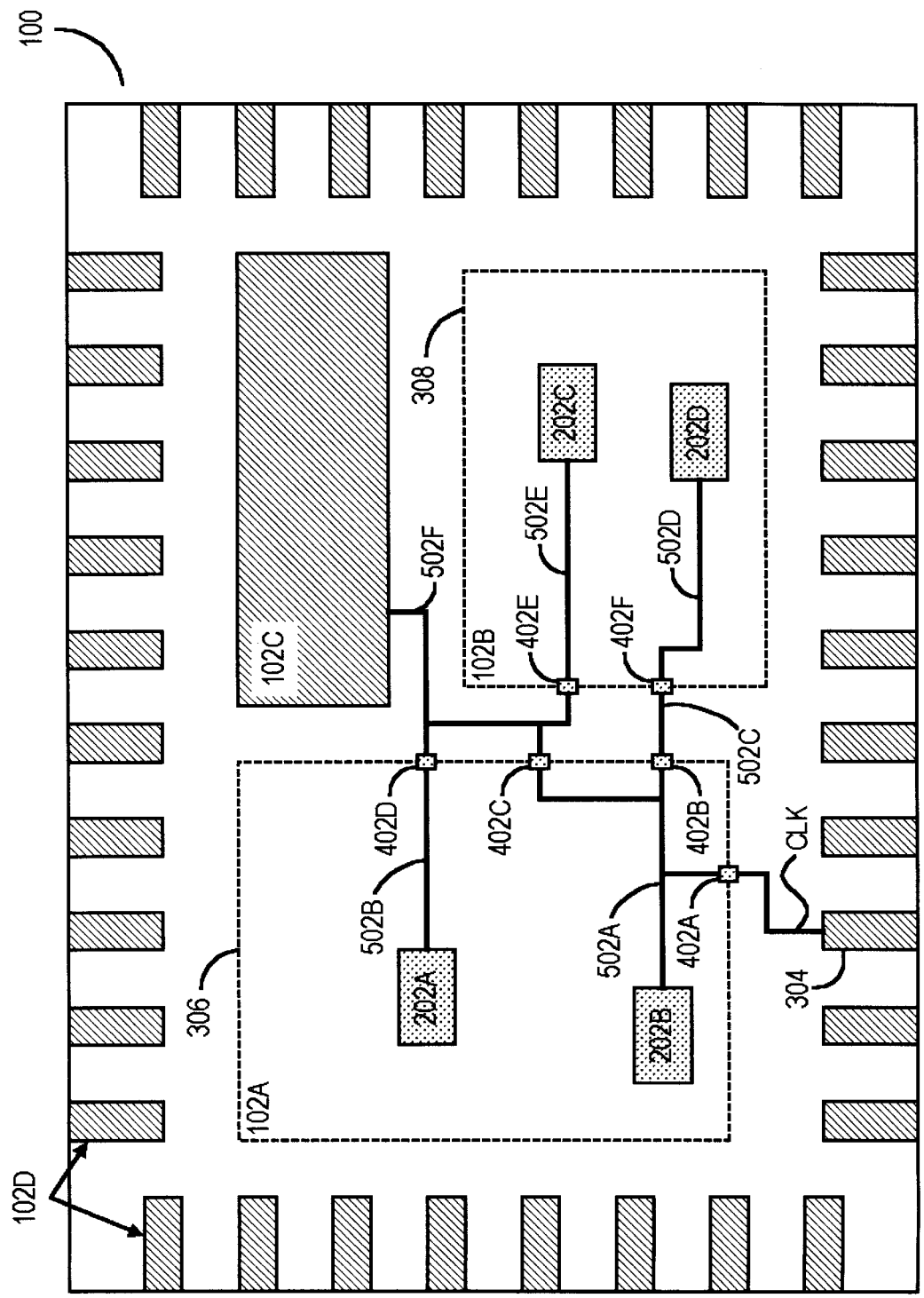
FIG. 4 is a block diagram of the circuit design of FIGS. 1 and 3 in which the global network is de-coupled in accordance with the present invention.

In addition to reconstructing the hierarchy of the selected soft blocks in step 812 (FIG. 8), CAD application 742 (FIG. 7) adds to the hierarchy of the selected soft blocks new connections of the de-coupled global networks, e.g., of wire fragments 502A–F (FIG. 4). For example, in circuit design 100, CAD application 742 (FIG. 7) adds the following to the hierarchical representation of circuit design 100 in high-level circuit specification 740A (FIG. 7): (i) a connection in the high-level global network CLK from pin 304 (FIG. 4) to 402A of soft block 102A, (i) a connection from pin 402B of soft block 102A to pin 402F of soft block 102B for wire fragment 502C, and (iii) a connection from pins 402C–D of soft block 102A to pin 402E of soft block 102B and hard block 102C for wire fragment 502F. In addition, CAD application 742 (FIG. 7) adds the following to the hierarchical specification of soft block 102A within high-level circuit specification 740A: (i) a connection between sub-block 202B (FIG. 4) and pins 402A–C for wire fragment 502A, (ii) a connection between sub-block 202A and pin 402D for wire fragment 502B. Furthermore, CAD application 742 (FIG. 7) adds the following to the hierarchical specification of soft block 102B within high-level circuit specification 740A: (i) a connection between sub-block 202C (FIG. 4) and pin 402E for wire fragment 502E, (ii) a connection between sub-block 202D and pin 402F for wire fragment 502D. Accordingly, CAD application 742 (FIG. 7) adds wire fragments 502A–F to the hierarchical specification of circuit design 100. CAD application 742 (FIG. 7) uses the conversion history database stored in step 804 (FIG. 8) as described above to reconstruct the hierarchy of circuit design 100 (FIG. 4) and soft blocks 102A–B which now include wire fragments 502A–F and pins 402A–F as described above.

In adding the above listed connections, CAD application 742 (FIG. 7) preserves the routing of global network CLK in wire fragments 502A–F (FIG. 4) to thereby preserve the timing characteristics of the original routing of global network CLK in step 808 (FIG. 8).

In the step 812 (FIG. 8), CAD application 742 (FIG. 7) modularizes the soft blocks specified by the circuit design engineer. Soft blocks not specified by the circuit design engineer are left in the flat representation formed in step 804 (FIG. 8). Thus, a circuit design engineer has the option to work on portions of circuit design 100 (FIG. 4) using a flat paradigm and other portions of circuit design 100 using a hierarchical paradigm. Accordingly, the circuit design engineer is provided with an exceptional degree of flexibility in working with circuit design 100.

After step 812 (FIG. 8), soft blocks 102A–B (FIG. 5) and other components of circuit design 100 are fully de-coupled. As used here, components of a circuit are de-coupled if the components share no blocks, elements, or lines. Since all global networks are logically severed at soft block boundaries, changes within a soft block do not effect any components outside the soft block and changes outside the soft block do not effect any components within the soft block. As a result, each de-coupled component of circuit design 100 can be processed independently of other components of circuit design 100.

In step 814 (FIG. 8), CAD application 742 (FIG. 7) routes all connections other than global networks in each of the soft blocks and within circuit design 100 (FIG. 4). In one embodiment, such routing is performing using the conventional Silicon Ensemble router which is commercially available from Cadence Design Systems, Inc. Routing such connections is typically the largest consumer of computer processing resources in realizing a circuit layout from a circuit design such as circuit design 100 (FIG. 4). However, routing lines of smaller blocks such as soft blocks 102A–B individually requires substantially less computer processing resources than routing lines throughout circuit design 100 as a whole. In fact, such is the primary advantage of hierarchical placement and routing paradigms over flat paradigms. Thus, the advantage of reduced computer processing of hierarchical circuit designs is realized in accordance with the present invention.

In addition, the minimization of signal timing and skew problems afforded by flat placement and routing systems is also realized by the flat routing of global networks in the manner described above with respect to steps 806–810. Thus, the advantages of both hierarchical and flat placement and routing systems are simultaneously achieved in accordance with the present invention.

In step 814 (FIG. 8), CAD application 742 (FIG. 7) also saves each of the blocks of circuit design 100 (FIG. 5), e.g., blocks 102A–C, with placement and routing completed as described above into a conventional netlist format such as the conventional and well-known Design Exchange Format in circuit layout specification 740B (FIG. 7). In addition, the de-coupled and independently processed soft blocks are logically re-joined such that the severed and fragmented global networks, e.g., global network CLK, is restored. Care should be taken to ensure that the global networks are accurately restored in the final representation of circuit design 100 (FIG. 4).

Since the components of circuit design 100 (FIG. 5) are fully de-coupled, each can be processed independently of other components. For example, soft block 102A can be modified, flattened, simulated, reconstructed, modified, and flattened again while the remainder of circuit design 100 remains unchanged. Assume, for example, that once processing according to logic flow diagram 800 (FIG. 8) is complete, a circuit design engineer detects that a portion of soft block 102A is erroneously designed. Conventional systems would require that the entirety of circuit design 100 be processed again for placement and routing to effect any changes in circuit design 100. However, in accordance with the present invention, soft block 102A can be processed alone to effect changes entirely within soft block 102A and the remainder of circuit design 100 can be left unchanged. Accordingly, iterative development of circuit design 100 using de-coupled placement and routing in accordance with the present invention is accelerated significantly over iterative development using conventional placement and routing techniques.

Figure 5:
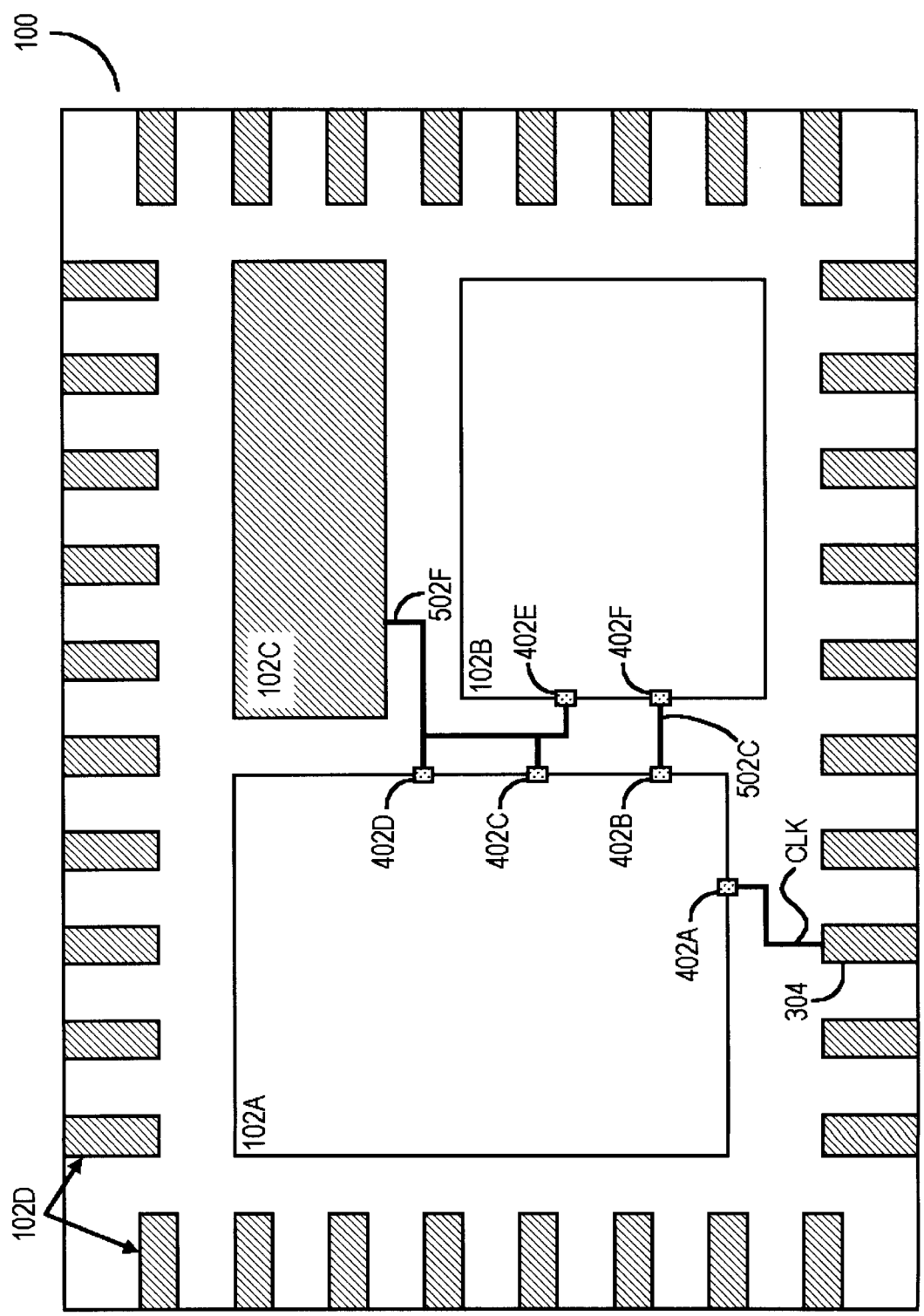
FIG. 5 is a block diagram of the circuit design of FIGS. 1, 3, and 4 in which the soft blocks are reconstructed in hierarchical form in accordance with the present invention.

Since soft block 102A is a subset of circuit design 100, soft block 102A can be processed using significantly less computer resources than are required to process the entirety of circuit design 100. In addition, soft block 102B can be processed concurrently with the processing of soft block 102A within computer system 700, within a separate computer system, or by a separate processor of a multiple processor computer system. In addition, either of soft blocks 102A–B can be maintained in a flat representation while the other is processed in a hierarchical representation. Accordingly, CAD application 742 (FIG. 7) provides a hybrid paradigm in which flat and hierarchical processing techniques can be used concurrently with respect to respective components of the same circuit design, e.g., circuit design 100 (FIG. 5).

After step 814 (FIG. 8), processing by CAD application 742 (FIG. 7) completes. The hybrid paradigm provided by CAD application 742 has significant advantages over either the flat paradigm or hierarchical paradigm in processing particularly large circuit designs. Such advantages are measured in terms of requisite computer processing resources and the quality and flexibility of circuit designs.

First, global networks can be routed in relatively high precision and accuracy while much of the substance of the entire circuit under design is represented in a hierarchical form. Accuracy in routing global networks is particularly important when designing a circuit and such affects timing of signal propagation through such a circuit. In addition, since routing is initially limited to global networks, such routing can be accomplished with relatively little computer resources as global networks typically represent a relatively small portion of the circuit under design. Routing of local networks, i.e., networks which exist only within a particular block, is postponed until the block itself is processed independently of other components of the circuit under design.

Second, the computer processing resources required to process the entirety of the circuit design, e.g., circuit design 100, is significantly reduced by processing placement and routing of component of each individual soft block of the circuit design independently. Such is the case since each soft block of the circuit design is significantly less complex than the entirety of the circuit design and computer processing resources required for processing a particular circuit is exponentially related to the complexity of the circuit. Accordingly, the sum of required processing resources for processing individual components of the circuit design is significantly less than the required processing resources for processing the circuit design as a whole.

Third, the hybrid paradigm facilitates easy modification of a circuit design such as circuit design 100. For example, once wire fragments CLK, 502C, and 502F (FIG. 5) are fixed, soft block 102A can be modified and flattened and can be subsequently modified and flattened without requiring flattening of soft block 102B. Accordingly, significant processing resources are saved in the multiple iterations of modification and flattening typically required to arrive at a finished design by a circuit design engineer. In a typical circuit design, numerous soft blocks can be processed individually, thereby realizing significant efficiency improvements relative to the simple two soft block example described herein.

Fourth, each of the soft blocks of a circuit design, e.g., soft blocks 102A–B, can be processed concurrently and can be processed in separate computer systems. Similarly, each of the soft blocks of a circuit design can be processed concurrently in separate processors of a multiple processor computer system. In either case, such concurrent processing can significantly reduce the amount of time required to process and finalize each of soft blocks 102A–B. It is important to note that such concurrent, independent routing of local networks within respective soft blocks can be achieved using conventional, commercially available routers even if such routers are not designed to route multiple parts of a circuit design concurrently. In particular, the soft blocks are fully de-coupled and share no data. Accordingly, concurrent access to shared data is unnecessary. In addition, there are no critical points in the processing at which routing of one of the soft blocks must wait for events in routing of another of the soft blocks since the de-coupled soft blocks are entirely independent. In short, the complexity which is typically inherent in concurrent computer processes which are dependent upon one another is avoided altogether since routing within each of the de-coupled soft blocks is independent of routing within all others of the soft blocks. Thus, all that is necessary to automatically route multiple soft blocks concurrently is to (i) distribute data representing the soft blocks to respective computer systems and to (ii) employ conventional automatic routers in each of the respective computer systems to thereby effect the automatic routing of the respective soft blocks.

Figure 10:
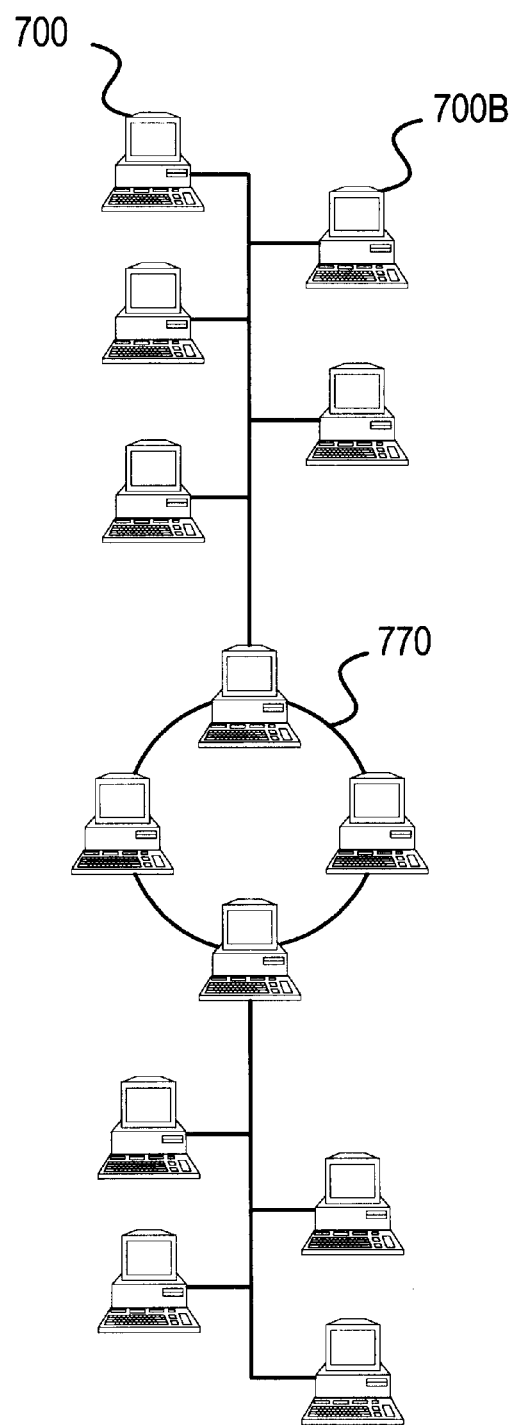
FIG. 10 is a block diagram of a computer network in which individual blocks of the circuit design of FIGS. 1, 3, and 4 are processed independently and concurrently by separate computer systems of the computer network.

For example, in one embodiment, final routing of soft block 102A is performed by CAD application 742 (FIG. 7) of computer system 700 (FIGS. 7 and 10) while final routing of soft block 102B (FIG. 5) is concurrently performed by an analogous CAD application of computer system 700B (FIG. 10). Computer system 700B is directly analogous to computer system 700 which is described in greater detail below. Computer systems 700 and 700B are coupled to one another through a computer network 770. Computer network 770 facilitates migration to computer system 700B from computer system 700 of data representing the element placement and interconnections of de-coupled soft block 102B (FIG. 5) for final routing. In an alternative embodiment, computer systems 700 and 700B are not coupled to one another through a computer network and such data is migrated to computer system 700B using removable and transportable storage media such as magnetic and/or writeable optical disks.

In an alternative embodiment, CAD application 742 (FIG. 7) performs final routing of soft block 102A (FIG. 5) in one of processors 702 (FIG. 7) while a separate instance of CAD application 742 concurrently performs final routing of soft block 102B (FIG. 5) in a separate one of processors 702 (FIG. 7). Timing and security issues pertaining to concurrent processing in a multiple processor computer system are avoided since soft blocks 102A–B (FIG. 5) are fully de-coupled and can be processed independently of one another.

Fifth, the division of circuit design components described above can be used at any level of a hierarchical circuit design. For example, two or more soft sub-blocks of soft block 102A can be partitioned by fixing network fragments between the soft sub-blocks in the specification of soft block 102A within high level circuit specification 740A (FIG. 7).

De-Coupling the Soft Blocks

As described above with respect to step 810 (FIG. 8), CAD application 742 (FIG. 7) de-couples circuit design 100 (FIG. 5) by severing global networks with pins at soft block boundaries. Step 810 (FIG. 8) is shown in greater detail as logic flow diagram 810 (FIG. 9).

Processing begins in step 902 in which CAD application 742 (FIG. 7) forms temporary flat netlist 740C from which a hierarchical design specification is subsequently reconstructed to include wire fragments of global networks in the manner described above.

Figure 9A:
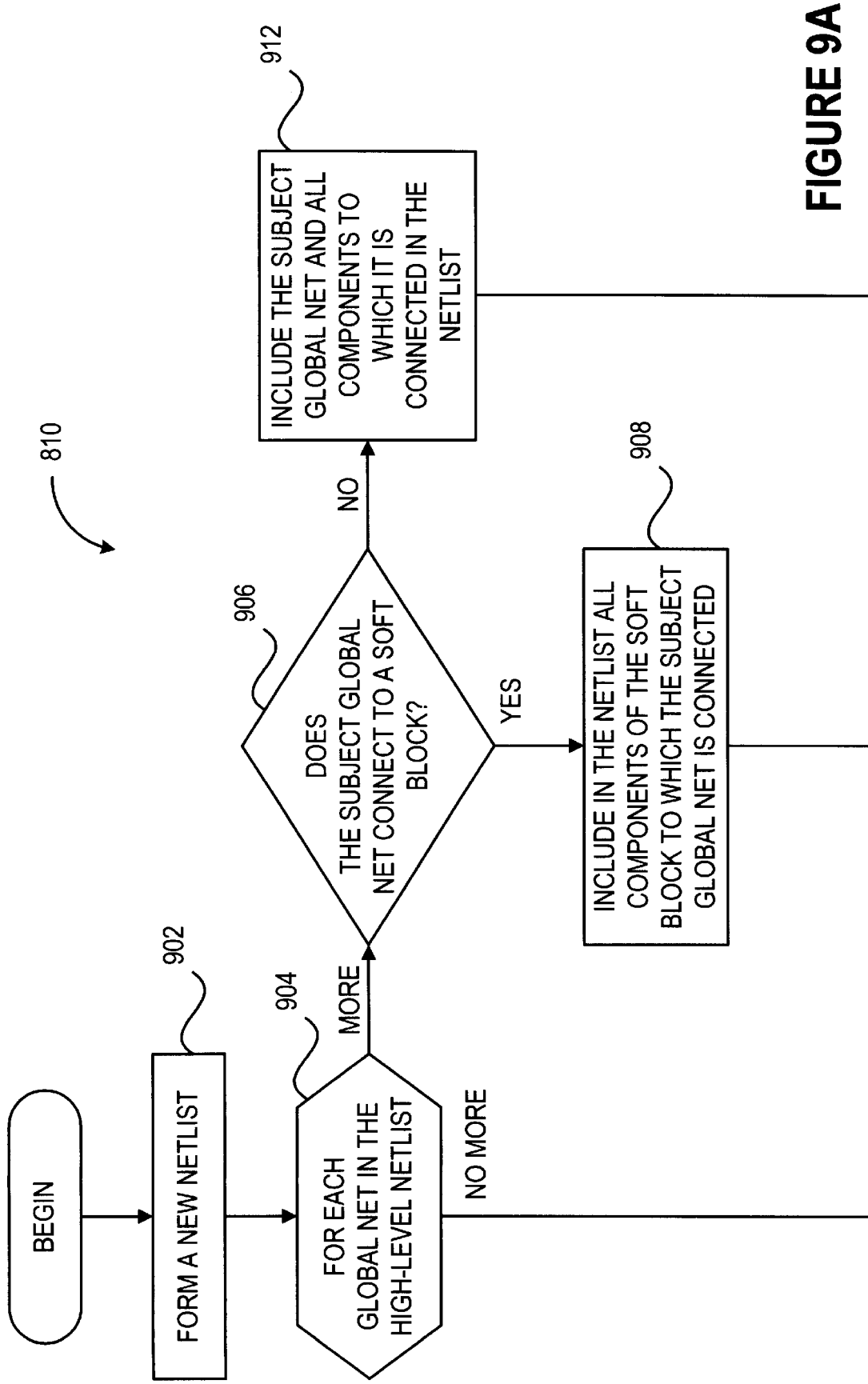
FIG. 9 is a logic flow diagram of the de-coupling of blocks of a circuit design in accordance with the present invention.

Loop step 904 (FIG. 9) and next step 914 define a loop in which each global network of circuit design 100 (FIG. 1) is processed according to steps 906–912 (FIG. 9). During a particular iteration of the loop of steps 904–914, the global network processed by CAD application 742 (FIG. 7) is referred to as the subject global network. For each global network, processing transfers to test step 904 (FIG. 9).

In test step 904, CAD application 742 (FIG. 7) determines whether the subject global network connects to any soft blocks of circuit design 100 (FIG. 1). If so, processing transfers to step 908 (FIG. 9) in which CAD application 742 (FIG. 7) includes in temporary flat netlist 740C all components of the soft block to which the subject global network is connected. AR such components are retrieved from specification of the soft block within high-level circuit specification 740A. In step 910 (FIG. 9), CAD application 742 (FIG. 7) stores data in temporary flat netlist 740C data indicating that such components and the portion of the subject global network are part of the soft block to which the subject global network is connected. After step 910 (FIG. 9), processing transfers through next step 914 to loop step 904 in which the next global network is processed.

If, in test step 906, the subject global network does not connect to a soft block, processing transfers to step 912 instead of step 908. In step 912, CAD application 742 (FIG. 7) includes in temporary flat netlist 740C data specifying the subject global network and all components to which the subject global network is connected. Such data is retrieved from high-level circuit specification 740A. Processing transfers from step 912 to next step 914 and steps 908–910 are skipped.

Once all global networks of circuit design 100 (FIG. 1) are processed, processing transfers from loop step 904 to loop step 916. Loop step 916 and next step 920 define a is loop in which each soft block of circuit design 100 (FIG. 1) are processed according to step 918 (FIG. 9). In step 918, CAD application 742 (FIG. 7) includes in temporary flat netlist 740C data specifying all global networks within the soft block and data specifying that all such global networks are part of the soft block. After all soft blocks have been processed according to the loop of steps 916–920 (FIG. 9), processing according to logic flow diagram 804, and therefore step 804 (FIG. 8), completes. According to logic flow diagram 804 (FIG. 9), only those components which are necessary for the routing and placement of global networks in circuit design 100 (FIG. 1) are flattened. As a result, much of the detail of circuit design 100 is not processed and the flattening of circuit design 100 in step 804 (FIG. 8) therefore requires relatively little computer processing resources.

Operating Environment of the CAD Application

In this illustrative embodiment, CAD application 742 (FIG. 7) is all or part of one or more computer processes executing within a computer system 700 as shown in FIG. 7. Computer system 700 includes processors 702 and memory 704 which is coupled to processors 702 through an interconnect 706. Interconnect 706 can be generally any interconnect mechanism for computer system components and can be, e.g., a bus, a crossbar, a mesh, a torus, or a hypercube. Processors 702 fetch from memory 704 computer instructions and execute the fetched computer instructions. In addition, processors 702 can fetch computer instructions through a computer network 770 through network access circuitry 760 such as a modem or ethernet network access circuitry. Processors 702 also read data from and write data to memory 704 and send data and control signals through interconnect 706 to one or more computer display devices 720 and receive data and control signals through interconnect 706 from one or more computer user input devices 730 in accordance with fetched and executed computer instructions.

Memory 704 can include any type of computer memory and can include, without limitation, randomly accessible memory (RAM), read-only memory (ROM), and storage devices which include storage media such as magnetic and/or optical disks. Memory 704 includes CAD application 742 which is all or part of a computer process which in turn executes within one or more of processors 702 from memory 704. Alternatively, CAD application 742 can be implemented as a collection of computer processes. A computer process is generally a collection of computer instructions and data which collectively define a task performed by computer system 700. Memory 704 also includes high-level circuit specification 740A, circuit layout specification 740B, and temporary flat netlist 740C.

Each of computer display devices 720 can be any type of computer display device including without limitation a printer, a cathode ray tube (CRT), a light-emitting diode (LED) display, or a liquid crystal display (LCD). Computer display devices 720 each receive from processors 702 control signals and data and, in response to such control signals, display the received data. Computer display devices 720, and the control thereof by processors 702, are conventional.

Each of user input devices 730 can be any type of user input device including, without limitation, a keyboard, a numeric keypad, or a pointing device such as an electronic mouse, trackball, lightpen, touch-sensitive pad, digitizing tablet, thumb wheels, joystick, or voice recognition device. Each of user input devices 730 generates signals in response to physical manipulation by a user and transmits those signals through interconnect 706 to processors 702.

As described above, CAD application 742 executes within one or more of processors 702 from memory 704. Specifically, CAD application 742 is all or part of one or more computer processes executing within computer system 700, i.e., processors 702 fetch computer instructions of CAD application 742 from memory 704 and execute those computer instructions. Processors 702, in executing CAD application 742, divide and de-couple soft blocks 102A–B (FIG. 4) of circuit design 100 in the manner described above such that each of soft blocks 102A–B can be processed independently of and concurrently with one another.

The above description is illustrative only and is not limiting. The present invention is limited only by the claims which follow.

What is claimed is:

1. A method for dividing a circuit design into independent portions which can be processed independently, the method comprising:

routing a global network to one or more components of each of one or more soft blocks of the circuit design;

dividing the global network at respective soft block boundaries of the one or more soft blocks into inside parts which are inside one of the soft blocks and outside parts which are outside the soft blocks; and including the outside parts of the global network in the circuit design in such a manner that the soft blocks can be processed independently of one another.

2. The method of claim 1 further comprising:

including the inside parts of the global network in the soft blocks as components of the soft blocks.

3. The method of claim 1 wherein the step of dividing comprises:

including, in the circuit design, pins at the respective soft block boundaries at points at which the global network intersects the respective soft block boundaries; and connecting the inside parts and outside parts to the pins.

4. The method of claim 3 wherein the step of including pins comprises:

including the pins in the circuit design; and connecting the outside parts to the pins within the circuit design.

5. The method of claim 3 further comprising:

including the inside parts of the global network in the soft blocks as components of the soft blocks; and further wherein the step of including the inside parts comprises:

including the pins in the soft blocks as components of the soft blocks; and connecting the inside parts to the pins within the soft blocks.

6. A method for designing a circuit which includes two or more soft blocks, the method comprising:

forming first and second flat blocks from first and second ones, respectively, of the soft blocks;

routing a global network through the first and second flat blocks;

de-coupling the global network at block boundaries of the first and second flat blocks to form one or more inside parts of the global network which are inside one of the soft blocks and outside parts of the global network which are outside the soft blocks;

reconstructing the first soft block from the first flat block to form a reconstructed first block which includes one or more inside parts of the global network; and designing the circuit using the reconstructed first block and the second flat block.

7. A method for designing a circuit which includes two or more soft blocks, the method comprising:

placing one or more circuit elements of the circuit;

routing a global network through the two or more soft blocks to the one or more circuit elements as placed;

de-coupling the global network at block boundaries of the two or more soft blocks to form one or more inside parts of the global network which are inside one of the soft blocks and one or more outside parts which are outside the soft blocks;

including in a first of the soft blocks one or more of the inside parts which are inside the first soft block;

including in a second of the soft blocks one or more of the inside parts which are inside the second soft block;

using a first computer processor to route lines within the first soft block other than the inside parts of the global network included in the first soft block; and using a second computer processor to route lines within the second soft block other than the inside parts of the global network included in the second soft block.

8. The method of claim 7 wherein the first and second computer processors are two different computer processors.

9. The method of claim 7 wherein the first and second computer processors are components of respective, different computer systems.

10. The method of claim 7 wherein both steps of using are performed concurrently.

11. A computer readable medium useful in association with a computer which includes a processor and a memory, the computer readable medium including computer instructions which are configured to cause the computer to divide a circuit design into independent portions which can be processed independently by:

routing a global network to one or more components of each of one or more soft blocks of the circuit design;

dividing the global network at respective soft block boundaries of the one or more soft blocks into inside parts which are inside one of the soft blocks and outside parts which are outside the soft blocks; and including the outside parts of the global network in the circuit design in such a manner that the soft blocks can be processed independently of one another.

12. The computer readable medium of claim 11 wherein the computer instruction are configured to cause the computer to divide the circuit design by also:

including the inside parts of the global network in the soft blocks as components of the soft blocks.

13. The computer readable medium of claim 11 wherein dividing comprises:

including, in the circuit design, pins at the respective soft block boundaries at points at which the global network intersects the respective soft block boundaries; and connecting the inside parts and outside parts to the pins.

14. The computer readable medium of claim 13 wherein the step of including pins comprises:

including the pins in the circuit design; and connecting the outside parts to the pins within the circuit design.

15. The computer readable medium of claim 13 wherein the computer instruction are configured to cause the computer to divide the circuit design by also:

including the inside parts of the global network in the soft blocks as components of the soft blocks; and further wherein the step of including the inside parts comprises:

including the pins in the soft blocks as components of the soft blocks; and connecting the inside parts to the pins within the soft blocks.

16. A computer readable medium useful in association with a computer which includes a processor and a memory, the computer readable medium including computer instructions which are configured to cause the computer to facilitate designing a circuit which includes two or more soft blocks by:
    forming first and second flat blocks from first and second ones, respectively, of the soft blocks;
    routing a global network through the first and second flat blocks;
    de-coupling the global network at block boundaries of the first and second flat blocks to form one or more inside parts of the global network which are inside one of the soft blocks and outside parts of the global network which are outside the soft blocks;
    reconstructing the first soft block from the first flat block to form a reconstructed first block which includes one or more inside parts of the global network; and
    designing the circuit using the reconstructed first block and the second flat block.

17. A computer readable medium useful in association with a computer which includes a processor and a memory, the computer readable medium including computer instructions which are configured to cause the computer to facilitate designing a circuit which includes two or more soft blocks by:
    placing one or more circuit elements of the circuit;
    routing a global network through the two or more soft blocks to the one or more circuit elements as placed;
    de-coupling the global network at block boundaries of the two or more soft blocks to form one or more inside parts of the global network which are inside one of the soft blocks and one or more outside parts which are outside the soft blocks;
    including in a first of the soft blocks one or more of the inside parts which are inside the first soft block;
    including in a second of the soft blocks one or more of the inside parts which are inside the second soft block;
    using a first computer processor to route lines within the first soft block other than the inside parts of the global network included in the first soft block; and
    using a second computer processor to route lines within the second soft block other than the inside parts of the global network included in the second soft block.

18. The computer readable medium of claim 17 wherein the first and second computer processors are two different computer processors.

19. The computer readable medium of claim 17 wherein the first and second computer processors are components of respective, different computer systems.

20. The computer readable medium of claim 17 wherein both steps of using are performed concurrently.

21. A computer system comprising:
    a processor;
    a memory operatively coupled to the processor; and
    a design processing module (i) which executes in the processor from the memory and (ii) which, when executed by the processor, causes the computer to divide a circuit design into independent portions which can be processed independently by:
        routing a global network to one or more components of each of one or more soft blocks of the circuit design;
        dividing the global network at respective soft block boundaries of the one or more soft blocks into inside parts which are inside one of the soft blocks and outside parts which are outside the soft blocks; and
        including the outside parts of the global network in the circuit design in such a manner that the soft blocks can be processed independently of one another.

22. The computer system of claim 21 wherein the design processing module causes the computer to divide the circuit design by also:
    including the inside parts of the global network in the soft blocks as components of the soft blocks.

23. The computer system of claim 21 wherein dividing comprises:
    including, in the circuit design, pins at the respective soft block boundaries at points at which the global network intersects the respective soft block boundaries; and
    connecting the inside parts and outside parts to the pins.

24. The computer system of claim 23 wherein the step of including pins comprises:
    including the pins in the circuit design; and
    connecting the outside parts to the pins within the circuit design.

25. The computer system of claim 23 wherein the design processing module causes the computer to divide the circuit design by also:
    including the inside parts of the global network in the soft blocks as components of the soft blocks; and
    further wherein the step of including the inside parts comprises:
        including the pins in the soft blocks as components of the soft blocks; and
        connecting the inside parts to the pins within the soft blocks.

26. A computer system comprising:
    a processor;
    a memory operatively coupled to the processor; and
    a design processing module (i) which executes in the processor from the memory and (ii) which, when executed by the processor, causes the computer to facilitate designing a circuit which includes two or more soft blocks by:
        forming first and second flat blocks from first and second ones, respectively, of the soft blocks;
        routing a global network through the first and second flat blocks;
        de-coupling the global network at block boundaries of the first and second flat blocks to form one or more inside parts of the global network which are inside one of the soft blocks and outside parts of the global network which are outside the soft blocks;
        reconstructing the first soft block from the first flat block to form a reconstructed first block which includes one or more inside parts of the global network; and
        designing the circuit using the reconstructed first block and the second flat block.

27. A computer system comprising:
    a processor;
    a memory operatively coupled to the processor; and
    a design processing module (i) which executes in the processor from the memory and (ii) which, when executed by the processor, causes the computer to facilitate designing a circuit which includes two or more soft blocks by:
        placing one or more circuit elements of the circuit;
        routing a global network through the two or more soft blocks to the one or more circuit elements as placed;
        de-coupling the global network at block boundaries of the two or more soft blocks to form one or more inside parts of the global network which are inside one of the soft blocks and one or more outside parts which are outside the soft blocks;

including in a first of the soft blocks one or more of the inside parts which are inside the first soft block;

including in a second of the soft blocks one or more of the inside parts which are inside the second soft block;

using a first computer processor to route lines within the first soft block other than the inside parts of the global network included in the first soft block; and using a second computer processor to route lines within the second soft block other than the inside parts of the global network included in the second soft block.

28. The computer system of claim 27 wherein the first and second computer processors are two different computer processors.

29. The computer system of claim 27 wherein the first and second computer processors are components of respective, different computer systems.

30. The computer system of claim 27 wherein both steps of using are performed concurrently.

* * * * *